(12) United States Patent
Nakamura (10) Patent No.: US 12,035,464 B2
(45) Date of Patent: Jul. 9, 2024

(54) STRETCHABLE MOUNTING BOARD AND METHOD FOR MANUFACTURING STRETCHABLE MOUNTING BOARD

(71) Applicant: Murata Manufacturing Co., Ltd., Nagaokakyo (JP)

(72) Inventor: Yui Nakamura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 157 days.

(21) Appl. No.: 17/842,178

(22) Filed: Jun. 16, 2022

(65) Prior Publication Data

US 2022/0312588 A1   Sep. 29, 2022

Related U.S. Application Data

(63) Continuation of application No. PCT/JP2021/029619, filed on Aug. 11, 2021.

(30) Foreign Application Priority Data

Sep. 29, 2020   (JP) .................................. 2020-163625

(51) Int. Cl.
*H05K 1/02* (2006.01)
*H05K 1/09* (2006.01)
*H05K 3/34* (2006.01)

(52) U.S. Cl.
CPC ........... *H05K 1/0283* (2013.01); *H05K 1/092* (2013.01); *H05K 3/34* (2013.01)

(58) Field of Classification Search
CPC ......... H05K 1/0283; H05K 1/092; H05K 3/34
See application file for complete search history.

(56) References Cited

U.S. PATENT DOCUMENTS

| 2012/0103678 A1 | 5/2012 | Inaba et al. |
| 2018/0027654 A1 | 1/2018 | Kanda et al. |
| 2022/0078904 A1 | 3/2022 | Katsu et al. |

FOREIGN PATENT DOCUMENTS

| JP | 2002042548 A | 2/2002 |
| JP | 2011159922 A | 8/2011 |
| JP | 5177027 B2 | 4/2013 |
| JP | 2018014381 A | 1/2018 |
| WO | 2020203135 A1 | 10/2020 |

OTHER PUBLICATIONS

International Search Report in PCT/JP2021/029619, mailed Nov. 2, 2021, 3 pages.

*Primary Examiner* — Jeremy C Norris
(74) *Attorney, Agent, or Firm* — ArentFox Schiff LLP (57) ABSTRACT

A stretchable mounting board that includes: a stretchable substrate; a mounting electrode portion on a main surface side of the stretchable substrate and containing a conductive filler and a resin; a solder portion connected to the mounting electrode portion; and an electronic component electrically connected to the mounting electrode portion with the solder portion interposed therebetween. The mounting electrode portion has a first main surface on a stretchable substrate side thereof, a second main surface on a solder portion side thereof, a first region including the first main surface, and a second region including the second main surface, and wherein, in a cross-section along a thickness direction of the mounting electrode portion passing through the first region and the second region, a sectional area of the conductive filler in the second region is larger than a sectional area of the conductive filler in the first region.

17 Claims, 6 Drawing Sheets

STRETCHABLE MOUNTING BOARD AND METHOD FOR MANUFACTURING STRETCHABLE MOUNTING BOARD

CROSS REFERENCE TO RELATED APPLICATIONS

The present application is a continuation of International application No. PCT/JP2021/029619, filed Aug. 11, 2021, which claims priority to Japanese Patent Application No. 2020-163625, filed Sep. 29, 2020, the entire contents of each of which are incorporated herein by reference.

FIELD OF THE INVENTION

The present invention relates to a stretchable mounting board and a method for manufacturing the stretchable mounting board.

BACKGROUND OF THE INVENTION

In recent years, a state or the like of a living body (for example, a human body) has been managed by acquiring and analyzing biological information using a wiring board.

Electronic components may be mounted on such a wiring board. For example, Patent Document 1 discloses a board which includes a bendable substrate, a bendable wiring pattern formed on the substrate, a conductive member formed on the wiring pattern, an electronic component, and a bonding member that bonds the conductive member and the electronic component.

Patent Document 1: Japanese Patent Application Laid-Open No. 2018-14381

SUMMARY OF THE INVENTION

In the board described in Patent Document 1, a solder is used as the bonding member, and on the other hand, a metal foil, metal plating, or a metal powder is used as the conductive member in order to improve a solder wettability. However, in a case where the conductive member having an excellent solder wettability and the electronic component are bonded with a solder interposed therebetween, a phenomenon called solder leaching occurs in which the conductive member and the solder react with each other to generate a brittle metal compound. In the board described in Patent Document 1, it is considered that such solder leaching is likely to occur in the whole conductive member, and thus the conductive member is likely to be broken as a whole, and as a result, the mounting strength of the electronic component is likely to be reduced.

In the board described in Patent Document 1, in a case where a metal foil or a metal powder is used as the conductive member, in order to secure the bendability of the whole board, it is necessary to reduce a region where the metal foil or the metal powder is provided and in contact with the solder, and a special device is required. On the other hand, in a case where metal plating is used as the conductive member, a bendability is easily secured, but in order to prevent a short circuit between the wiring patterns, it is necessary to protect the substrate not to form the metal plating between the wiring patterns, and the process becomes complicated. In this case, it is necessary to use a substrate having a resistance to a plating solution. As described above, the board described in Patent Document 1 has room for improvement in that the board can be manufactured by a simple process.

The present invention has been made to solve the above problems, and an object of the present invention is to provide a stretchable mounting board that can be manufactured by a simple process while a mounting strength of an electronic component is secured. Further, another object of the present invention is to provide a method for manufacturing the stretchable mounting board.

A stretchable mounting board of the present invention includes: a stretchable substrate; a mounting electrode portion on a main surface side of the stretchable substrate and containing a conductive filler and a resin; a solder portion connected to the mounting electrode portion; and an electronic component electrically connected to the mounting electrode portion with the solder portion interposed therebetween. The mounting electrode portion has a first main surface on a stretchable substrate side thereof, a second main surface on a solder portion side thereof, a first region including the first main surface, and a second region including the second main surface, and wherein, in a cross-section along a thickness direction of the mounting electrode portion passing through the first region and the second region, a sectional area of the conductive filler in the second region is larger than a sectional area of the conductive filler in the first region.

A method for manufacturing a stretchable mounting board according to the present invention includes: forming a first electrode layer by applying a first conductive paste containing a first conductive filler and a thermosetting resin to a main surface side of a stretchable substrate; performing a first heat treatment on the first electrode layer; forming a second electrode layer by applying a second conductive paste containing a second conductive filler and a thermoplastic resin to the first electrode layer on a side thereof opposite to the stretchable substrate; performing a second heat treatment on the second electrode layer; applying a solder paste onto the second electrode layer; mounting an electronic component on the solder paste; and performing a third heat treatment to melt and solidify the solder paste to form a solder portion that bonds the electronic component and the first electrode layer with the solder portion interposed therebetween.

According to the present invention, it is possible to provide the stretchable mounting board that can be manufactured by a simple process while the mounting strength of the electronic component is secured. Further, according to the present invention, it is possible to provide a method for manufacturing the stretchable mounting board.

DETAILED DESCRIPTION OF THE INVENTION

Hereinafter, a stretchable mounting board of the present invention and a method for manufacturing the stretchable mounting board of the present invention will be described. Note that the present invention is not limited to the following configuration, and may be appropriately modified without departing from the gist of the present invention. The present invention also includes a combination of a plurality of preferred configurations described below.

Figure 1:
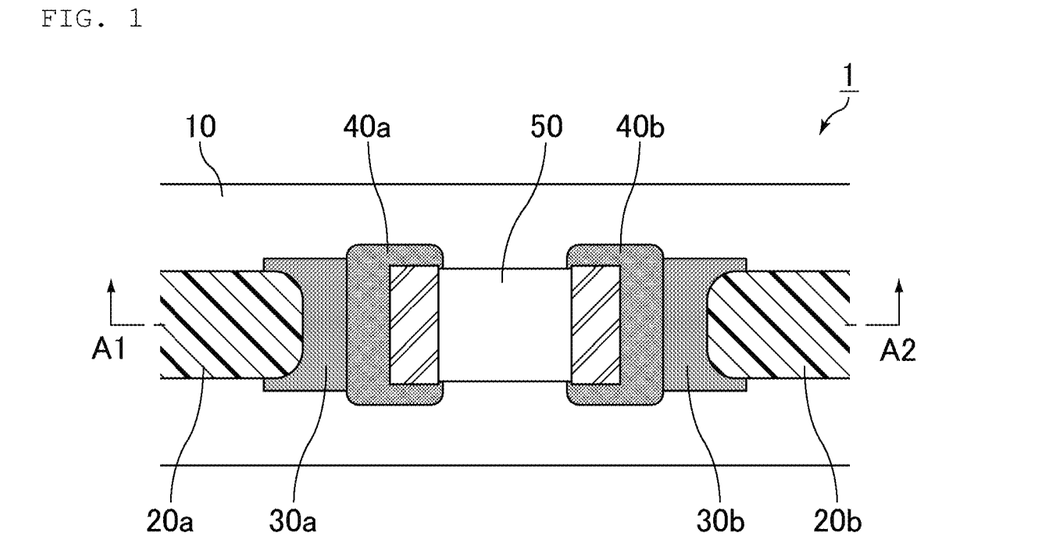
FIG. 1 is a schematic plan view illustrating an example of a stretchable mounting board of the present invention.
Figure 2:
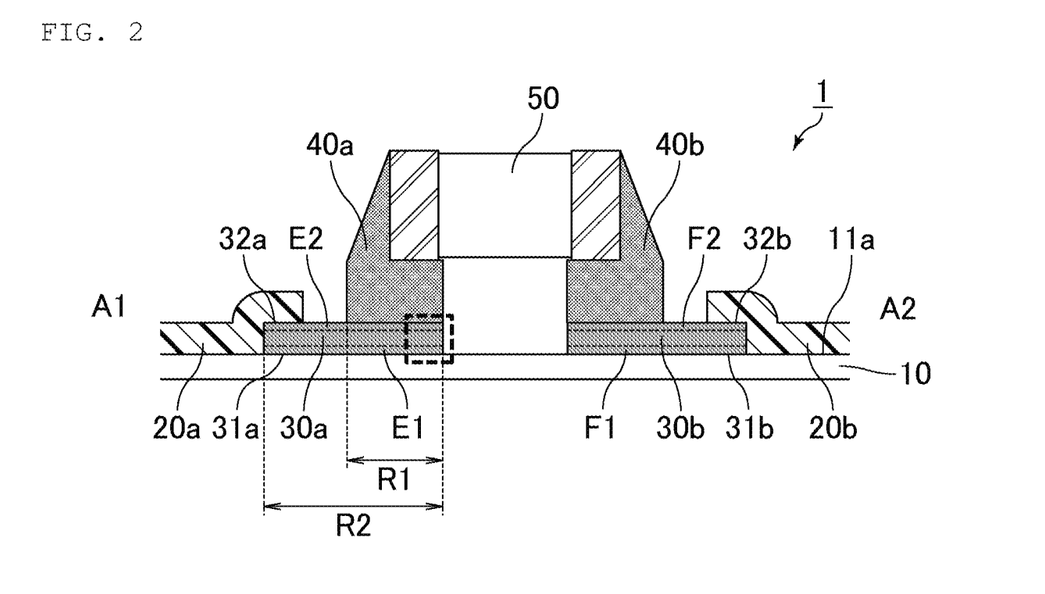
FIG. 2 is a schematic sectional view illustrating a portion corresponding to line segment A1-A2 in FIG. 1.

FIG. 1 is a schematic plan view illustrating an example of a stretchable mounting board of the present invention. FIG. 2 is a schematic sectional view illustrating a portion corresponding to line segment A1-A2 in FIG. 1.

As illustrated in FIGS. 1 and 2, a stretchable mounting board 1 includes a stretchable substrate 10, a stretchable wiring 20a, a stretchable wiring 20b, a mounting electrode portion 30a, a mounting electrode portion 30b, a solder portion 40a, a solder portion 40b, and an electronic component 50.

The stretchable substrate 10 preferably contains at least one type of resin selected from the group consisting of a urethane-based resin, a silicone-based resin, an acrylic resin, and an olefin-based resin. Examples of the urethane-based resin include thermoplastic polyurethane (TPU).

In a case where the stretchable mounting board 1 is attached to a living body, the thickness of the stretchable substrate 10 is preferably 100 μm or less, and more preferably 50 μm or less, from the viewpoint of not inhibiting expansion and contraction of a surface of the living body. In addition, the thickness of the stretchable substrate 10 is preferably 10 μm or more.

In the present specification, the thickness of each member and each layer means a length in a thickness direction (in FIG. 2, a vertical direction) orthogonal to the main surface of the stretchable substrate in sectional view. In addition, this thickness is indicated as a thickness in a state where the stretchable mounting board is not stretched unless otherwise specified.

The stretchable wiring 20a is provided on one main surface 11a of the stretchable substrate 10, and is provided such that an end portion sandwiches an end portion of the mounting electrode portion 30a in the thickness direction between the stretchable wiring and the stretchable substrate 10. In this manner, the stretchable wiring 20a and the mounting electrode portion 30a are connected to each other at the end portions thereof.

The stretchable wiring 20b is provided on one main surface 11a of the stretchable substrate 10, and is provided such that an end portion sandwiches an end portion of the mounting electrode portion 30b in the thickness direction between the stretchable wiring and the stretchable substrate 10. In this manner, the stretchable wiring 20b and the mounting electrode portion 30b are connected to each other at the end portions thereof.

The stretchable wiring 20a and the stretchable wiring 20b contain, for example, a conductive filler and a resin.

Examples of the conductive filler contained in the stretchable wiring 20a and the stretchable wiring 20b include a metal filler such as a silver filler, a copper filler, and a nickel filler. Among them, the conductive filler contained in the stretchable wiring 20a and the stretchable wiring 20b is preferably a silver filler.

The conductive filler contained in the stretchable wiring 20a and the conductive filler contained in the stretchable wiring 20b preferably have the same metal type, but may have different metal types.

Examples of the shape of the conductive filler contained in the stretchable wiring 20a and the stretchable wiring 20b include a plate shape, a spherical shape, and the like.

The conductive filler contained in the stretchable wiring 20a and the conductive filler contained in the stretchable wiring 20b preferably have the same shape, but may have different shapes.

The particle size of the conductive filler contained in the stretchable wiring 20a and the stretchable wiring 20b is preferably 0.01 μm to 10 μm. The particle size of the conductive filler means a length of a largest side in a case where the conductive filler has a plate shape, and means the diameter in a case where the conductive filler has a spherical shape.

The conductive filler contained in the stretchable wiring 20a and the conductive filler contained in the stretchable wiring 20b preferably have the same particle size, but may have different particle sizes.

The resin contained in the stretchable wiring 20a and the stretchable wiring 20b is preferably at least one type of elastomer resin selected from the group consisting of an acrylic resin, an epoxy resin, a urethane resin, and a silicone resin.

The resin contained in the stretchable wiring 20a and the resin contained in the stretchable wiring 20b preferably have the same resin type, but may have different resin types.

The thicknesses of the stretchable wiring 20a and the stretchable wiring 20b are each preferably 100 μm or less, and more preferably 50 μm or less. In addition, the thicknesses of the stretchable wiring 20a and the stretchable wiring 20b are each preferably 1 μm or more.

The thicknesses of the stretchable wiring 20a and the stretchable wiring 20b are preferably the same as each other, but may be different from each other.

The mounting electrode portion 30a and the mounting electrode portion 30b are positioned on one main surface 11a side of the stretchable substrate 10, and here, are provided on one main surface 11a of the stretchable substrate 10. The mounting electrode portion 30a and the mounting electrode portion 30b are provided at positions separated from each other.

The mounting electrode portion 30a and the mounting electrode portion 30b contain a conductive filler and a resin.

Examples of the conductive filler contained in the mounting electrode portion 30a and the mounting electrode portion 30b include a metal filler such as a silver filler, a copper fillers, and a nickel filler. Among them, the conductive filler contained in the mounting electrode portion 30a and the mounting electrode portion 30b is preferably a silver filler.

The conductive filler contained in the mounting electrode portion 30a and the conductive filler contained in the mounting electrode portion 30b preferably have the same metal type, but may have different metal types.

Examples of the shape of the conductive filler contained in the mounting electrode portion 30a and the mounting electrode portion 30b include a plate shape, a spherical shape, and the like. Among them, the conductive filler contained in the mounting electrode portion 30a and the mounting electrode portion 30b preferably has a plate shape.

The conductive filler contained in the mounting electrode portion 30a and the conductive filler contained in the mounting electrode portion 30b preferably have the same shape, but may have different shapes.

The resin contained in the mounting electrode portion 30a and the mounting electrode portion 30b is preferably a thermosetting resin such as a thermosetting polyester-based resin.

The resin contained in the mounting electrode portion 30a and the resin contained in the mounting electrode portion 30b preferably have the same resin type, but may have different resin types.

The mounting electrode portion 30a has a first main surface 31a and a second main surface 32a.

The first main surface 31a of the mounting electrode portion 30a is a main surface positioned on the stretchable substrate 10 side. More specifically, the first main surface 31a of the mounting electrode portion 30a faces one main surface 11a of the stretchable substrate 10, and here, is in contact with the one main surface 11a of the stretchable substrate 10.

The second main surface 32a of the mounting electrode portion 30a is a main surface positioned on the solder portion 40a side.

The mounting electrode portion 30b has a first main surface 31b and a second main surface 32b.

The first main surface 31b of the mounting electrode portion 30b is a main surface positioned on the stretchable substrate 10 side. More specifically, the first main surface 31b of the mounting electrode portion 30b faces the one main surface 11a of the stretchable substrate 10, and here, is in contact with the one main surface 11a of the stretchable substrate 10.

The second main surface 32b of the mounting electrode portion 30b is a main surface positioned on the solder portion 40b side.

Details of the mounting electrode portion 30a and the mounting electrode portion 30b, which are characteristic portions of the stretchable mounting board of the present invention, will be described later.

The solder portion 40a is connected to the mounting electrode portion 30a.

The solder portion 40b is connected to the mounting electrode portion 30b.

The solder portion 40a and the solder portion 40b are provided at positions separated from each other.

The solder portion 40a and the solder portion 40b preferably contain tin and bismuth as metal components, and are preferably so-called low-temperature solders. By using such low-temperature solders as the solder portion 40a and the solder portion 40b, also in a case where the heat-resistant temperatures of the stretchable substrate 10, the stretchable wiring 20a, the stretchable wiring 20b, and the electronic component 50 are low, the electronic component 50 can be mounted without damaging these components.

The metal component of the solder portion 40a and the metal component of the solder portion 40b preferably have the same metal type, but may have different metal types.

The electronic component 50 is electrically connected to the mounting electrode portion 30a with the solder portion 40a interposed therebetween. The electronic component 50 is electrically connected to the mounting electrode portion 30b with the solder portion 40b interposed therebetween.

Examples of the electronic component 50 include an amplifier (operational amplifier, transistor, and the like), a diode, an integrated circuit (IC), a capacitor, a resistor, and an inductor.

The stretchable mounting board 1 may further include an electrode connected to the stretchable wiring 20a at a position different from the mounting electrode portion 30a and the mounting electrode portion 30b. In addition, the stretchable mounting board 1 may further include an electrode connected to the stretchable wiring 20b at a position different from the mounting electrode portion 30a and the mounting electrode portion 30b. The stretchable mounting board 1 can function as a sensor by being attached to a living body with such an electrode interposed therebetween.

Such an electrode is preferably a gel electrode. By interposing the gel electrode, the stretchable mounting board 1 is easily attached to the living body. The gel electrode includes, for example, a conductive gel material containing water, alcohol, a humectant, an electrolyte, and the like. Examples of such a gel material include a hydrogel.

Figure 3:
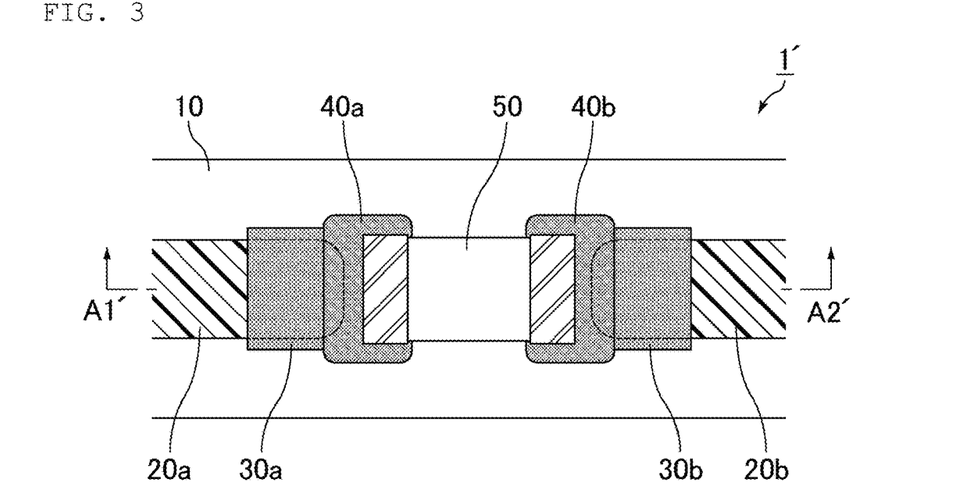
FIG. 3 is a schematic plan view illustrating another example of the stretchable mounting board of the present invention.
Figure 4:
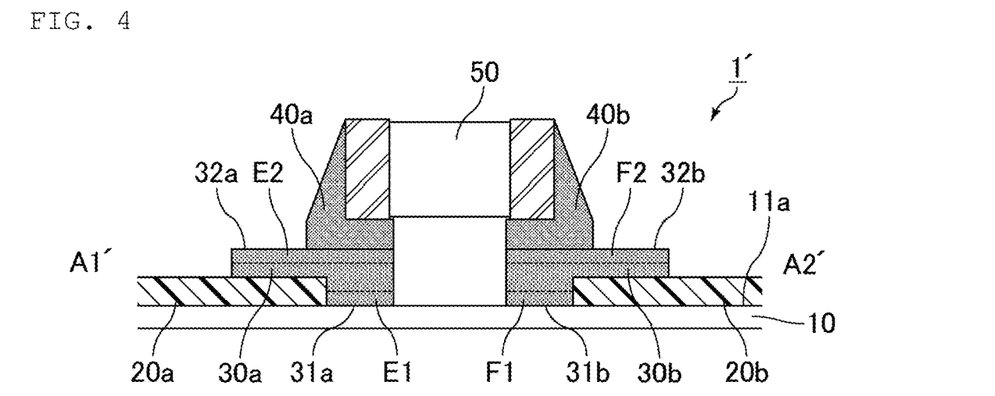
FIG. 4 is a schematic sectional view illustrating a portion corresponding to line segment A1'-A2' in FIG. 3.

FIG. 3 is a schematic plan view illustrating another example of the stretchable mounting board of the present invention. FIG. 4 is a schematic sectional view illustrating a portion corresponding to line segment A1'-A2' in FIG. 3.

As in the stretchable mounting board 1' illustrated in FIGS. 3 and 4, the end portion of the stretchable wiring 20a may be provided between the stretchable substrate 10 and the mounting electrode portion 30a. In addition, the end portion of the stretchable wiring 20b may be provided between the stretchable substrate 10 and the mounting electrode portion 30b.

The mounting electrode portion 30a and the mounting electrode portion 30b will be described below while a method for manufacturing the stretchable mounting board 1 is described as an example of the method for manufacturing the stretchable mounting board of the present invention.

<First Electrode Layer Forming Step>

Figure 5:
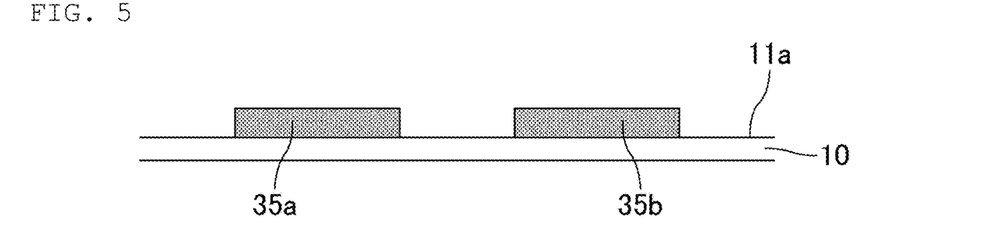
FIG. 5 is a schematic sectional view illustrating a first electrode layer forming step in an example of a method for manufacturing the stretchable mounting board of the present invention.

FIG. 5 is a schematic sectional view illustrating a first electrode layer forming step in an example of the method for manufacturing the stretchable mounting board of the present invention.

A first conductive paste containing a first conductive filler and a thermosetting resin is applied to one main surface 11a side of the stretchable substrate 10, here, one main surface 11a of the stretchable substrate 10, and then subjected to heat treatment to form a first electrode layer 35a and a first electrode layer 35b at positions separated from each other as illustrated in FIG. 5. The first electrode layer 35a and the first electrode layer 35b thus formed are configured by the first conductive paste, but more specifically, the first electrode layer 35a and the first electrode layer 35b contain the first conductive filler and the thermosetting resin.

Since the first conductive paste contains a thermosetting resin, the wettability of the solder paste described later with respect to the first conductive paste is poor. That is, the wettability of the solder paste described later is deteriorated with respect to the first electrode layer 35a and the first electrode layer 35b configured by the first conductive paste.

The first conductive paste is preferably applied by a screen printing method. As a result, the application of the first conductive paste can be easily performed.

The application of the first conductive paste for forming the first electrode layer 35a and the application of the first conductive paste for forming the first electrode layer 35b are preferably performed at the same timing. As a result, both applications of the first conductive paste can be performed efficiently. Thereafter, the heat treatment for the first conductive paste for forming the first electrode layer 35a and the heat treatment for the first conductive paste for forming the first electrode layer 35b are performed at the same timing, whereby the first electrode layer 35a and the first electrode layer 35b can be efficiently formed at the same timing.

The application of the first conductive paste for forming the first electrode layer 35a and the application of the first conductive paste for forming the first electrode layer 35b may be performed at different timings. For example, after the first electrode layer 35a is formed by applying the first conductive paste for forming the first electrode layer 35a and performing heat treatment, the first electrode layer 35b may be formed by applying the first conductive paste for forming the first electrode layer 35b and performing heat treatment.

Examples of the first conductive filler include a metal filler such as a silver filler, a copper filler, and a nickel filler. Among them, the first conductive filler is preferably a silver filler.

The first conductive filler contained in the first conductive paste for forming the first electrode layer 35a and the first conductive filler contained in the first conductive paste for forming the first electrode layer 35b preferably have the same metal type, but may have different metal types.

Examples of the shape of the first conductive filler include a plate shape and a spherical shape. Among them, the first conductive filler preferably has a plate shape.

The first conductive filler contained in the first conductive paste for forming the first electrode layer 35a and the first conductive filler contained in the first conductive paste for forming the first electrode layer 35b preferably have the same shape, but may have different shapes.

Examples of the thermosetting resin include a thermosetting polyester-based resin.

The thermosetting resin contained in the first conductive paste for forming the first electrode layer 35a and the thermosetting resin contained in the first conductive paste for forming the first electrode layer 35b preferably have the same resin type, but may have different resin types.

The first conductive paste may further contain a solvent. Examples of such a solvent include diethylene glycol monoethyl ether acetate.

In a case where the first conductive paste contains a solvent, the solvent contained in the first conductive paste for forming the first electrode layer 35a and the solvent contained in the first conductive paste for forming the first electrode layer 35b preferably have the same solvent type, but may have different solvent types.

The first conductive paste may further contain an additive such as fine powder silica.

<Second Electrode Layer Forming Step>

Figure 6:
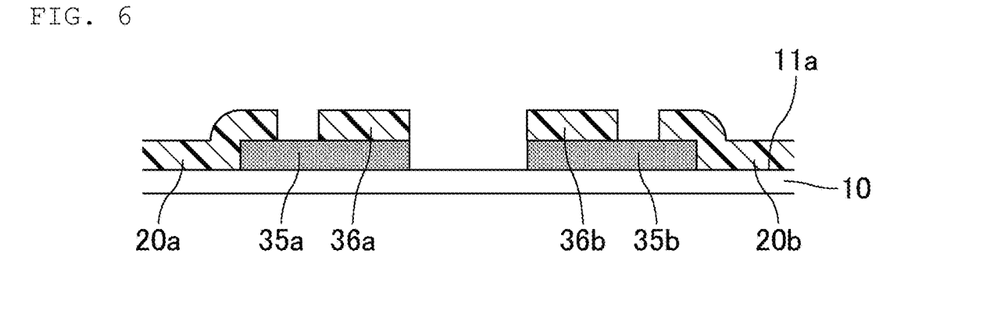
FIG. 6 is a schematic sectional view illustrating a second electrode layer forming step in an example of the method for manufacturing the stretchable mounting board of the present invention.

FIG. 6 is a schematic sectional view illustrating a second electrode layer forming step in an example of the method for manufacturing the stretchable mounting board of the present invention.

A second conductive paste containing a second conductive filler and a thermoplastic resin is applied to the first electrode layer 35a and the first electrode layer 35b on the side opposite to the stretchable substrate 10, and then subjected to heat treatment to form a second electrode layer 36a and a second electrode layer 36b at positions separated from each other as illustrated in FIG. 6. The second electrode layer 36a and the second electrode layer 36b thus formed are configured by the second conductive paste, but more specifically, the second electrode layer 36a and the second electrode layer 36b contain the second conductive filler and the thermoplastic resin.

Since the second conductive paste contains a thermoplastic resin, the wettability of the solder paste described later with respect to the second conductive paste is excellent. That is, the wettability of the solder paste described later is improved with respect to the second electrode layer 36a and the second electrode layer 36b configured by the second conductive paste.

The second conductive paste is preferably applied by a screen printing method. As a result, the application of the second conductive paste can be easily performed.

Both the application of the first conductive paste in the first electrode layer forming step and the application of the second conductive paste in the second electrode layer forming step are preferably performed by the screen printing method. As a result, it is a matter of course that the application of the first conductive paste in the first electrode layer forming step and the application of the second conductive paste in the second electrode layer forming step can be easily performed, and since the same device can be used, the manufacturing efficiency of the stretchable mounting board 1 obtained later is enhanced.

The application of the second conductive paste for forming the second electrode layer 36a and the application of the second conductive paste for forming the second electrode layer 36b are preferably performed at the same timing. As a result, both applications of the second conductive paste can be performed efficiently. Thereafter, the heat treatment for the second conductive paste for forming the second electrode layer 36a and the heat treatment for the second conductive paste for forming the second electrode layer 36b are performed at the same timing, whereby the second electrode layer 36a and the second electrode layer 36b can be efficiently formed at the same timing.

The application of the second conductive paste for forming the second electrode layer 36a and the application of the second conductive paste for forming the second electrode layer 36b may be performed at different timings. For example, after the second electrode layer 36a is formed by applying the second conductive paste for forming the second electrode layer 36a and performing heat treatment, the second electrode layer 36b may be formed by applying the second conductive paste for forming the second electrode layer 36b and performing heat treatment.

Examples of the second conductive filler include a metal filler such as a silver filler, a copper filler, and a nickel filler. Among them, the second conductive filler is preferably a silver filler.

The second conductive filler contained in the second conductive paste for forming the second electrode layer 36a and the second conductive filler contained in the second conductive paste for forming the second electrode layer 36b preferably have the same metal type, but may have different metal types.

The first conductive filler and the second conductive filler preferably have the same metal type, but may have different metal types.

Examples of the shape of the second conductive filler include a plate shape and a spherical shape.

The second conductive filler contained in the second conductive paste for forming the second electrode layer 36a and the second conductive filler contained in the second conductive paste for forming the second electrode layer 36b preferably have the same shape, but may have different shapes.

The first conductive filler and the second conductive filler preferably have the same shape, but may have different shapes.

Examples of the thermoplastic resin include a thermoplastic acrylic resin and a thermoplastic urethane resin (for example, thermoplastic polyurethane).

The thermoplastic resin contained in the second conductive paste for forming the second electrode layer 36a and the thermoplastic resin contained in the second conductive paste for forming the second electrode layer 36b preferably have the same resin type, but may have different resin types.

The second conductive paste may further contain a solvent. Examples of such a solvent include diethylene glycol monoethyl ether acetate.

In a case where the second conductive paste contains a solvent, the solvent contained in the second conductive paste for forming the second electrode layer 36a and the solvent contained in the second conductive paste for forming the second electrode layer 36b preferably have the same solvent type, but may have different solvent types.

In this step, the second conductive paste is applied by a screen printing method or the like to one main surface 11a of the stretchable substrate 10 and a position to sandwich the end portions of the first electrode layer 35a and the first electrode layer 35b with the stretchable substrate 10 in the thickness direction and then subjected to heat treatment to further form the stretchable wiring 20a and the stretchable wiring 20b as illustrated in FIG. 6.

The application of the second conductive paste for forming the stretchable wiring 20a and the application of the second conductive paste for forming the stretchable wiring 20b are preferably performed at the same timing, but may be performed at different timings.

The application of the second conductive paste for forming the stretchable wiring 20a and the stretchable wiring 20b and the application of the second conductive paste for forming the second electrode layer 36a and the second electrode layer 36b are preferably performed at the same timing. As a result, these second conductive pastes can be efficiently applied. Thereafter, the heat treatment for the second conductive paste for forming the stretchable wiring 20a and the stretchable wiring 20b and the heat treatment for the second conductive paste for forming the second electrode layer 36a and the second electrode layer 36b are performed at the same timing, whereby the stretchable wiring 20a, the stretchable wiring 20b, the second electrode layer 36a, and the second electrode layer 36b can be efficiently formed at the same timing.

The application of the second conductive paste for forming the stretchable wiring 20a and the stretchable wiring 20b and the application of the second conductive paste for forming the second electrode layer 36a and the second electrode layer 36b may be performed at different timings. For example, after the stretchable wiring 20a and the stretchable wiring 20b are formed by applying the second conductive paste for forming the stretchable wiring 20a and the stretchable wiring 20b and performing heat treatment, the second electrode layer 36a and the second electrode layer 36b may be formed by applying the second conductive paste for forming the second electrode layer 36a and the second electrode layer 36b and performing heat treatment. Alternatively, after the second electrode layer 36a and the second electrode layer 36b are formed by applying the second conductive paste for forming the second electrode layer 36a and the second electrode layer 36b and performing heat treatment, the stretchable wiring 20a and the stretchable wiring 20b may be formed by applying the second conductive paste for forming the stretchable wiring 20a and the stretchable wiring 20b and performing heat treatment.

The conductive paste for forming the stretchable wiring 20a and the stretchable wiring 20b is preferably the second conductive paste as described above, but may not be the second conductive paste.

<Electronic Component Mounting Step>

Figure 7:
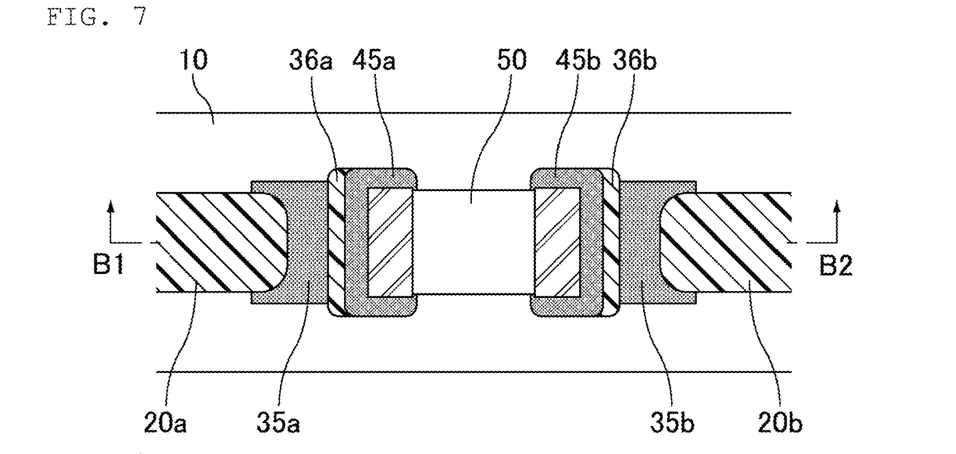
FIG. 7 is a schematic plan view illustrating an electronic component mounting step in an example of the method for manufacturing the stretchable mounting board of the present invention.
Figure 8:
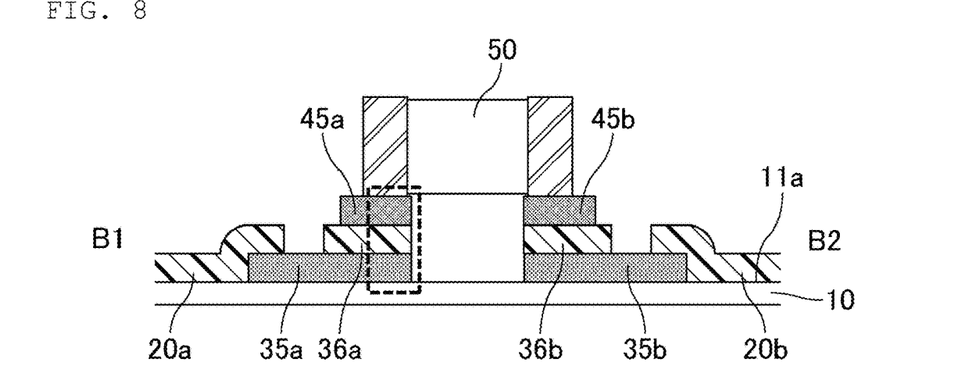
FIG. 8 is a schematic sectional view illustrating a portion corresponding to line segment B1-B2 in FIG. 7.

FIG. 7 is a schematic plan view illustrating an electronic component mounting step in an example of the method for manufacturing the stretchable mounting board of the present invention. FIG. 8 is a schematic sectional view illustrating a portion corresponding to line segment B1-B2 in FIG. 7.

A solder paste 45a is applied onto the second electrode layer 36a. More specifically, the solder paste 45a is applied to the second electrode layer 36a on the side opposite to the first electrode layer 35a so as not to be in contact with the first electrode layer 35a.

The solder paste 45b is applied onto the second electrode layer 36b. More specifically, the solder paste 45b is applied to the second electrode layer 36b on the side opposite to the first electrode layer 35b so as not to be in contact with the first electrode layer 35b.

The application of the solder paste 45a and the solder paste 45b are performed by, for example, printing using a metal mask or the like.

The solder paste 45a and the solder paste 45b preferably contain tin and bismuth as metal components, and are preferably so-called low-temperature solder pastes. By using such a low-temperature solder paste, also in a case where the heat-resistant temperatures of the stretchable substrate 10, the stretchable wiring 20a, the stretchable wiring 20b, and the electronic component 50 are low, the electronic component 50 can be mounted without damaging these components.

The metal component of the solder paste 45a and the metal component of the solder paste 45b preferably have the same metal type, but may have different metal types.

The solder paste 45a and the solder paste 45b may further contain a flux component in addition to the metal component.

Examples of the flux component include rosin flux.

When the solder paste 45a and the solder paste 45b contain a flux component, the flux component of the solder paste 45a and the flux component of the solder paste 45b preferably have the same flux type, but may have different flux types.

Next, the electronic component 50 is mounted on the solder paste 45a and the solder paste 45b as illustrated in FIGS. 7 and 8, and then subjected to heat treatment in a reflow furnace. As a result, the electronic component 50 and the first electrode layer 35a are bonded with the solder portion 40a interposed therebetween while the solder paste 45a is melted and solidified to form the solder portion 40a (see FIG. 2). Further, the electronic component 50 and the first electrode layer 35b are bonded with the solder portion 40b interposed therebetween while the solder paste 45b is melted and solidified to form the solder portion 40b (see FIG. 2). At this time, the obtained first electrode layer 35a and first electrode layer 35b become the mounting electrode portion 30a and the mounting electrode portion 30b (see FIG. 2 for each), respectively.

The top temperature of the heat treatment at the time of the heat treatment in the reflow furnace is preferably 150° C. to 190° C.

A formation process of the mounting electrode portion 30a will be described below.

Figure 9:
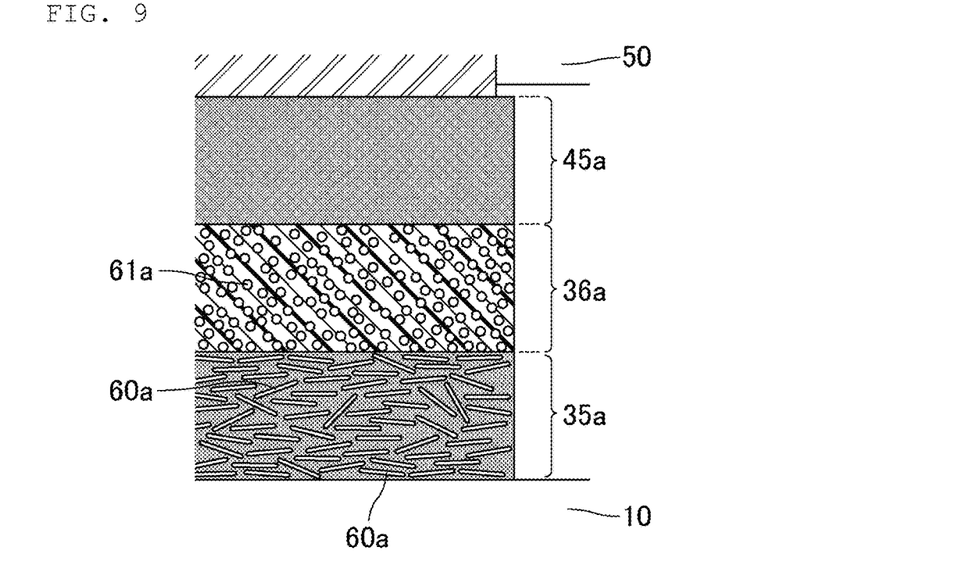
FIG. 9 is an enlarged view of a region surrounded by a dotted line in FIG. 8, and is a schematic sectional view illustrating a state before heat treatment of a solder paste is performed.
Figure 10:
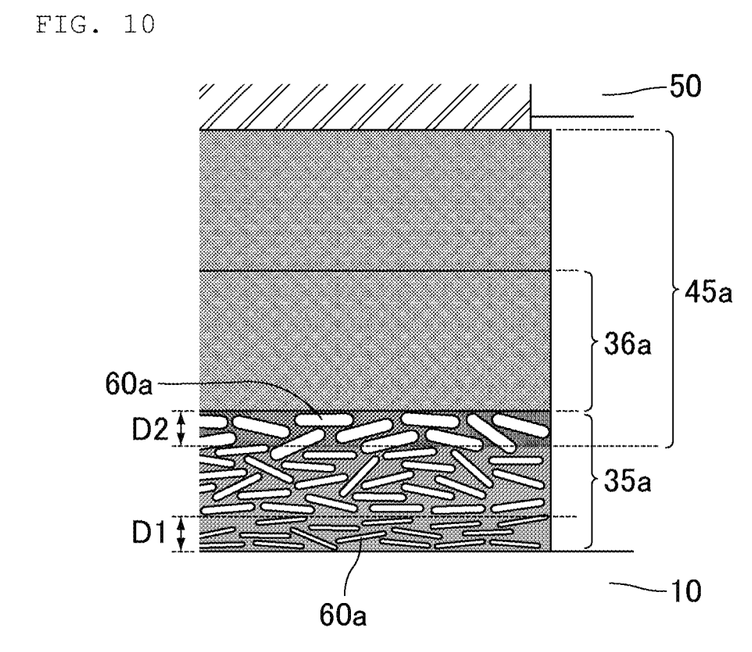
FIG. 10 is a schematic sectional view illustrating a state in the middle of the heat treatment of the solder paste with respect to the state illustrated in FIG. 9.
Figure 11:
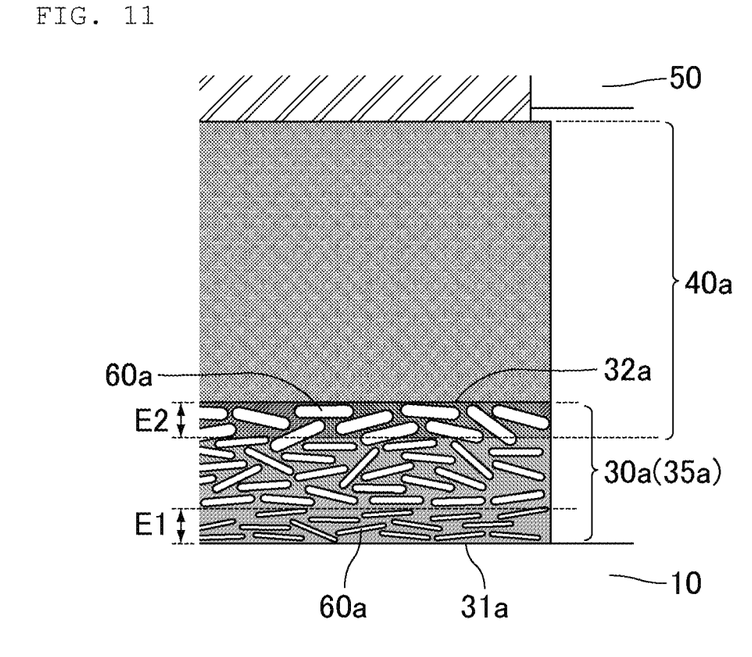
FIG. 11 is a schematic sectional view illustrating a state after the heat treatment of the solder paste is performed with respect to the state illustrated in FIG. 9.

FIG. 9 is an enlarged view of a region surrounded by a dotted line in FIG. 8, and is a schematic sectional view illustrating a state before heat treatment of the solder paste is performed. FIG. 10 is a schematic sectional view illustrating a state in the middle of the heat treatment of the solder paste with respect to the state illustrated in FIG. 9. FIG. 11 is a schematic sectional view illustrating a state after the heat treatment of the solder paste is performed with respect to the state illustrated in FIG. 9.

As illustrated in FIG. 9, in a state before the heat treatment of the solder paste 45a is performed, the first electrode layer 35a contains a conductive filler 60a (a plate shape in FIG. 9), and the second electrode layer 36a contains a conductive filler 61a (a spherical shape in FIG. 9).

When the heat treatment of the solder paste 45a is performed with respect to the state illustrated in FIG. 9, since the wettability of the solder paste 45a with respect to the second electrode layer 36a is excellent, as illustrated in FIG. 10, the solder paste 45a spreads out to the second electrode layer 36a in a molten state, so that the second electrode layer 36a is taken into the solder paste 45a. Further, the solder paste 45a spreads out from the second electrode layer 36a side to the first electrode layer 35a side beyond the interface between both layers. Therefore, the conductive filler 60a present in a region D2 near the interface in the first electrode layer 35a between the first electrode layer 35a and the second electrode layer 36a reacts with the metal component of the solder paste 45a, whereby the connection between the first electrode layer 35a and the solder paste 45a is secured. In such a state, the conductive filler 60a present in the region D2 has a larger sectional area due to the reaction with the metal component of the solder paste 45a.

On the other hand, since the wettability of the solder paste 45a with respect to the first electrode layer 35a is poor, as illustrated in FIG. 10, the solder paste 45a does not excessively spread out to the first electrode layer 35a, more specifically, hardly spreads out to the interface between the first electrode layer 35a and the stretchable substrate 10. Therefore, the connection between the stretchable substrate 10 and the first electrode layer 35a is secured. In such a state, in the first electrode layer 35a, the sectional area of the conductive filler 60a present in the region D1 near the interface between the first electrode layer 35a and the stretchable substrate 10 substantially maintains the sectional area in the first electrode layer forming step, and is smaller than the sectional area of the conductive filler 60a present in the region D2.

Thereafter, when the heat treatment of the solder paste 45a is completed and the solder paste 45a is solidified, as illustrated in FIG. 11, the solder portion 40a is formed at a position including the second electrode layer 36a, and the electronic component 50 and the first electrode layer 35a are bonded to each other with the solder portion 40a interposed therebetween. At this time, by using the obtained first electrode layer 35a as the mounting electrode portion 30a, the state illustrated in FIGS. 1 and 2 is obtained.

The formation process of the mounting electrode portion 30b is similar to the process of forming the mounting electrode portion 30a.

As described above, the stretchable mounting board 1 illustrated in FIGS. 1 and 2 is manufactured.

As described above, the stretchable mounting board 1 can be manufactured by a simple process using the first conductive paste having a poor wettability of the solder paste and the second conductive paste having an excellent wettability of the solder paste in combination.

As illustrated in FIGS. 2 and 11, a first region E1 including the first main surface 31a and a second region E2 including the second main surface 32a are present in the mounting electrode portion 30a. More specifically, when the mounting electrode portion 30a is divided into four in the thickness direction, the first region E1 indicates a region including the first main surface 31a, and the second region E2 indicates a region including the second main surface 32a.

The first region E1 of the mounting electrode portion 30a is derived from the region D1 illustrated in FIG. 10. The second region E2 of the mounting electrode portion 30a is derived from the region D2 illustrated in FIG. 10. Therefore, as illustrated in FIG. 11, in the mounting electrode portion 30a, when the section including the first region E1 and the second region E2 is viewed, the sectional area of the conductive filler 60a present in the second region E2 is larger than the sectional area of the conductive filler 60a present in the first region E1.

Since it can be said that the second region E2 of the mounting electrode portion 30a is derived from the region D2 illustrated in FIG. 10, that is, the region where the solder paste 45a spreads out to the first electrode layer 35a side, it can be said that the connection between the second region E2 of the mounting electrode portion 30a and the solder portion 40a is secured.

Since it can be said that the first region E1 of the mounting electrode portion 30a is derived from the region D1 illustrated in FIG. 10, that is, the region where the solder paste 45a hardly spreads out to the first electrode layer 35a side, it can be said that the connection between the stretchable substrate 10 and the first region E1 of the mounting electrode portion 30a is secured.

As described above, in the mounting electrode portion 30a, the fact that the sectional area of the conductive filler 60a present in the second region E2 is larger than the sectional area of the conductive filler 60a present in the first region E1 means that while the connection between the second region E2 of the mounting electrode portion 30a and the solder portion 40a is secured, the connection between the stretchable substrate 10 and the first region E1 of the mounting electrode portion 30a is secured, and as a result, the mounting strength of the electronic component 50 is secured.

As illustrated in FIG. 2, a first region F1 including first main surface 31b and second region F2 including second main surface 32b are present in the mounting electrode portion 30b. It can be said that the first region F1 and the second region F2 of the mounting electrode portion 30b are similar to the first region E1 and the second region E2 of the mounting electrode portion 30a. That is, in the mounting electrode portion 30b, when the section including the first region F1 and the second region F2 is viewed, the sectional area of the conductive filler present in the second region F2 is larger than the sectional area of the conductive filler present in the first region F1. As described above, in the mounting electrode portion 30b, the fact that the sectional area of the conductive filler present in the second region F2 is larger than the sectional area of the conductive filler present in the first region F1 means that while the connection between the second region F2 of the mounting electrode portion 30b and the solder portion 40b is secured, the connection between the stretchable substrate 10 and the first region F1 of the mounting electrode portion 30b is secured, and as a result, the mounting strength of the electronic component 50 is secured.

In the mounting electrode portion, the sectional area of the conductive filler present in the first region and the sectional area of the conductive filler present in the second region are determined as follows.

Figure 12:
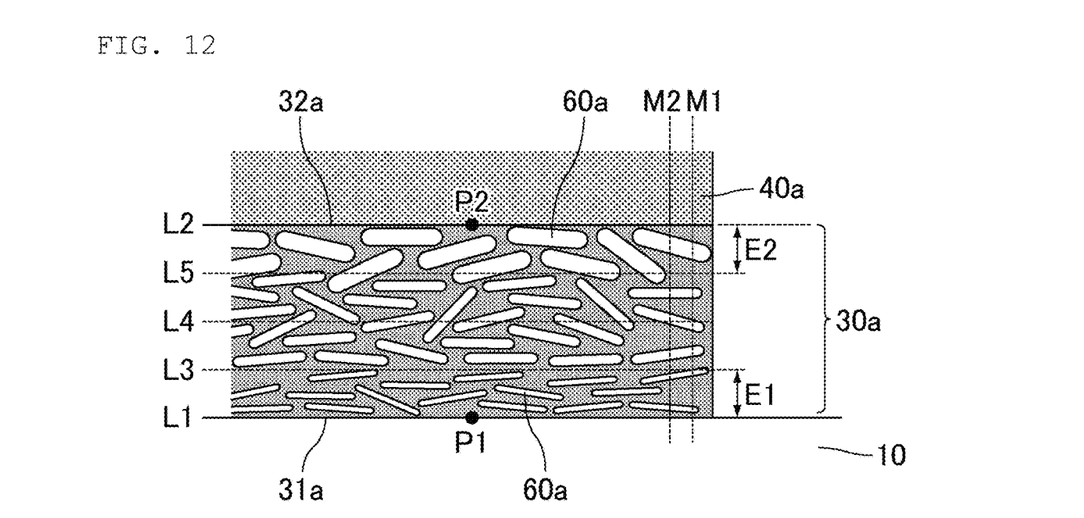
FIG. 12 is an enlarged schematic sectional view illustrating a region surrounded by a dotted line in FIG. 2.

FIG. 12 is an enlarged schematic sectional view illustrating a region surrounded by a dotted line in FIG. 2.

First, by performing polishing or the like on the stretchable mounting board, a section which is along the thickness direction as illustrated in FIG. 12 and includes the stretchable substrate 10, the mounting electrode portion 30a, and the solder portion 40a are exposed. Then, a sectional photograph of the exposed section is taken using a scanning electron microscope (SEM).

Next, by confirming the obtained sectional photograph, a region other than the stretchable substrate 10 where a resin (excluding voids) is present is determined as the mounting electrode portion 30a, and then, in the mounting electrode portion 30a, a first end point P1 positioned closest to the stretchable substrate 10 in the thickness direction and a second end point P2 positioned closest to the solder portion 40a in the thickness direction are determined. Then, a first straight line L1 passing through the first end point P1 and extending in a direction orthogonal to the thickness direction and a second straight line L2 passing through the second end point P2 and parallel to the first straight line L1 are determined. It can also be said that the first straight line L1 and the second straight line L2 determined in this manner correspond to the first main surface 31a and the second main surface 32a of the mounting electrode portion 30a, respectively. Thereafter, a third straight line L3, a fourth straight line L4, and a fifth straight line L5 are further determined in order from the first straight line L1 side so as to divide the distance in the thickness direction between the first straight line L1 and the second straight line L2 into four. In this way, in the mounting electrode portion 30a, a region between the first straight line L1 and the third straight line L3 is determined as the first region E1, and a region between the second straight line L2 and the fifth straight line L5 is determined as the second region E2.

Next, ten straight lines are drawn in the thickness direction at intervals of 5 µm to traverse the first region E1 and the second region E2 with respect to the mounting electrode portion 30a. Then, for each of the ten straight lines, the number of intersections with the conductive filler 60a present in the first region E1 is counted. For each of the 10 straight lines, the number of intersections with the conductive filler 60a present in the second region E2 is counted. At this time, it is assumed that not only the conductive filler 60a of which the whole is present in the first region E1 but also the conductive filler 60a of which a part is present in the first region E1 are present in the first region E1. In addition, not only the conductive filler 60a of which the whole is present in the second region E2 but also the conductive filler 60a of which a part is present in the second region E2 are assumed to be present in the second region E2.

In FIG. 12, a straight line M1 and a straight line M2 having an interval of 5 µm are illustrated as examples of two straight lines among the 10 straight lines. For each of the straight line M1 and the straight line M2, the number of intersections with the conductive filler 60a present in the first region E1 is four, and the number of intersections with the conductive filler 60a present in the second region E2 is two. Similarly, for each of the remaining eight straight lines, the intersections with the conductive fillers 60a present in the first region E1 and the intersections with the conductive fillers 60a present in the second region E2 are counted.

Thereafter, an average value G1 of the ten count values obtained for the first region E1 is calculated. In addition, an average value G2 of the ten count values obtained for the second region E2 is calculated. Further, a case where the average value G1 is larger than the average value G2 is regarded as a case where the sectional area of the conductive filler 60a present in the second region E2 is larger than the sectional area of the conductive filler 60a present in the first region E1.

In the mounting electrode portion 30b, the sectional area of the conductive filler present in the first region F1 and the sectional area of the conductive filler present in the second region F2 are also determined in the same manner as in the above-described method.

As illustrated in FIG. 11, the solder portion 40a preferably extends in the second region E2 of the mounting electrode portion 30a. In this case, as can be seen from the formation process of the mounting electrode portion 30a described above, it can be said that the conductive filler 60a present in the region D2 easily reacts with the metal component of the solder paste 45a in the state illustrated in FIG. 10. As a result, the connection between the second region E2 of the mounting electrode portion 30a and the solder portion 40a is easily secured. In addition, in this case, the mounting electrode portion 30a further includes the component of the solder portion 40a in the second region E2.

Whether the solder portion extends in the second region of the mounting electrode portion can be confirmed as follows. First, the stretchable mounting board is polished to expose a section along the thickness direction. Next, the exposed section is subjected to element mapping by scanning electron microscope-energy dispersive X-ray analysis (SEM-EDX). Then, in the obtained element mapping diagram, it is confirmed whether or not the metal component of the solder portion is present in the second region of the mounting electrode portion.

In the mounting electrode portion 30a, the conductive filler present in the second region E2 is preferably integrated with the solder portion 40a. In this case, as can be seen from the formation process of the mounting electrode portion 30a described above, it can be said that in the state illustrated in FIG. 10, the conductive filler 60a present in the region D2 reacts with the metal component of the solder paste 45a, whereby the sectional area of the conductive filler 60a is considerably increased. As a result, the connection between the second region E2 of the mounting electrode portion 30a and the solder portion 40a is sufficiently secured.

The thickness of the mounting electrode portion 30a is preferably 10 µm or more. In this case, as can be seen from the formation process of the mounting electrode portion 30a described above, it can be said that the thickness of the first electrode layer 35a is sufficiently large, and thus the stretchable substrate 10 and the solder paste 45a are sufficiently separated from each other in the thickness direction. Therefore, the influence of the metal component of the solder paste 45a hardly reaches the interface between the stretchable substrate 10 and the first electrode layer 35a, and as a result, the connection between the stretchable substrate 10 and the first electrode layer 35a is sufficiently secured. That is, since the thickness of the mounting electrode portion 30a is 10 µm or more, the connection between the stretchable substrate 10 and the first region E1 of the mounting electrode portion 30a is sufficiently secured.

On the other hand, when the thickness of the mounting electrode portion 30a is excessively large, as can be seen from the formation process of the stretchable wiring 20a described above, the second conductive paste is applied by the screen printing method or the like to the position to sandwich the end portion of the first electrode layer 35a with the stretchable substrate 10 in the thickness direction, that is, applied to a position where a step is large, so that the applied second conductive paste easily bleeds, and as a result, the stretchable wiring 20a is easily cut by the step. In addition, when the thickness of the mounting electrode portion 30a is excessively large, in the formation process of the stretchable wiring 20a described above, the coating film of the second conductive paste is difficult to dry, so that the manufacturing efficiency is reduced, or the variation in the thickness of the coating film of the second conductive paste is increased, so that the uniformity of the coating film is deteriorated. In addition to such a viewpoint, from the viewpoint of reducing the height of the stretchable mounting board 1, the thickness of the mounting electrode portion 30a is preferably 40 µm or less.

The thicknesses of the mounting electrode portion 30a and the mounting electrode portion 30b are preferably the same as each other, but may be different from each other.

As illustrated in FIG. 2, in a direction parallel to one main surface 11a of the stretchable substrate 10, that is, in a direction orthogonal to the thickness direction, a length R1 of a region in contact with the solder portion 40a in the second region E2 of the mounting electrode portion 30a is preferably smaller than a length R2 of the whole second region E2 of the mounting electrode portion 30a. In this case, the connection between the second region E2 of the mounting electrode portion 30a and the solder portion 40a is secured at the minimum. On the other hand, as can be seen from the formation process of the mounting electrode portion 30a described above, in the state illustrated in FIG. 10, the influence of the metal component of the solder paste 45a hardly reaches the whole region D2 of the first electrode layer 35a, and as a result, the strength of the mounting electrode portion 30a itself is easily secured.

In the direction parallel to the one main surface 11a of the stretchable substrate 10, the length R1 of the region in contact with the solder portion 40a in the second region E2 of the mounting electrode portion 30a may be the same as the length R2 of the whole second region E2 of the mounting electrode portion 30a. In this case, the contact area between the second region E2 of the mounting electrode portion 30a and the solder portion 40a increases, and thus the connection between the second region E2 of the mounting electrode portion 30a and the solder portion 40a is sufficiently secured.

Preferable characteristics of the above-described mounting electrode portion 30a can be similarly applied to the mounting electrode portion 30b.

As described above, in the stretchable mounting board 1, while both the connection between the mounting electrode portion 30a and the solder portion 40a and the connection between the stretchable substrate 10 and the mounting electrode portion 30a are secured, both the connection between the mounting electrode portion 30b and the solder portion 40b and the connection between the stretchable substrate 10 and the mounting electrode portion 30b are secured, so that the mounting strength of the electronic component 50 is secured.

An aspect in which the sectional area of the conductive filler present in the second region is larger than the sectional area of the conductive filler present in the first region in both the mounting electrode portion 30a and the mounting electrode portion 30b has been described above as a preferred aspect. On the other hand, an aspect may be described in which the sectional area of the conductive filler present in the second region may be larger than the sectional area of the conductive filler present in the first region in one of the mounting electrode portion 30a and the mounting electrode portion 30b. Also in such a case, the mounting strength of the electronic component 50 is secured at the minimum. That is, in the stretchable mounting board 1, it is sufficient if the sectional area of the conductive filler present in the second region is larger than the sectional area of the conductive filler present in the first region in at least one of the mounting electrode portion 30a and the mounting electrode portion 30b.

EXAMPLE

Hereinafter, an example in which the stretchable mounting board of the present invention and the method for manufacturing the stretchable mounting board of the present invention are more specifically disclosed will be described. Note that the present invention is not limited only to this example.

First Example

The stretchable mounting board of a first example was manufactured by the following method.

<First Electrode Layer Forming Step>

The first conductive paste was applied to one main surface of the stretchable substrate by the screen printing method, and then subjected to heat treatment at 140° C. for 30 minutes in the air atmosphere to form a first electrode layer having the configuration illustrated in FIG. 5. The thickness of the first electrode layer was about 12 µm as measured by an image measurement system having a laser autofocus mechanism.

As the first conductive paste, a paste containing a plate-shaped silver filler, a thermosetting polyester-based resin, a blocked isocyanate, diethylene glycol monoethyl ether acetate, and fine powder silica was used.

Here, the first conductive paste contained a blocked isocyanate, but in this step, a polymerization reaction occurred by performing heat treatment at 140° C. that was equal to or higher than the dissociation temperature of a blocking agent. Therefore, the obtained first electrode layer contained a plate-shaped silver filler and a cured product of a polyester-based resin and isocyanate. Incidentally, in order to cause the polymerization reaction described above, heat treatment at a temperature (for example, 140° C. or higher)

equal to or higher than the dissociation temperature of the blocking agent may be performed not in this step but in the second electrode layer forming step to be described later.

As the stretchable substrate, one including thermoplastic polyurethane was used.

<Second Electrode Layer Forming Step>

The second conductive paste was applied to the first electrode layer on the side opposite to the stretchable substrate by the screen printing method, and applied at the same timing to one main surface of the stretchable substrate and the position to sandwich the end portion of the first electrode layer with the stretchable substrate in the thickness direction. Thereafter, the applied second conductive paste was subjected to heat treatment at 140° C. for 30 minutes in the air atmosphere to form a second electrode layer and a stretchable wiring having the configuration illustrated in FIG. 6.

As the second conductive paste, a paste containing a spherical silver filler, a thermoplastic acrylic copolymer resin, and diethylene glycol monoethyl ether acetate was used. Therefore, the obtained second electrode layer and stretchable wiring contained a spherical silver filler and an acrylic copolymer resin.

<Electronic Component Mounting Step>

The solder paste was applied to the second electrode layer on the side opposite to the first electrode layer by printing using a metal mask so as not to be in contact with the first electrode layer.

As the solder paste, one containing tin, bismuth, a solvent, and a rosin flux was used.

Next, the 1005M-sized electronic component was mounted on the solder paste as illustrated in FIGS. 7 and 8, and then subjected to heat treatment at a top temperature of 180° C. in a reflow furnace. As a result, the electronic component and the first electrode layer were bonded with the solder portion interposed therebetween while the solder paste was melted and solidified to form a solder portion. Here, the first electrode layer thus obtained was used as a mounting electrode portion.

As described above, the stretchable mounting board of the first example having the configuration illustrated in FIGS. 1 and 2 was manufactured.

First Comparative Example

A stretchable mounting board of a first comparative example was manufactured in the same manner as in the stretchable mounting board of the first example except that the first electrode layer was formed as thin as about 8 μm in the first electrode layer forming step.

[Evaluation 1]

The sectional photographs of a state at the time of completion of the second electrode layer forming step and a state at the time of completion of the electronic component mounting step in the manufacturing process of the stretchable mounting board of the first example were taken using the scanning electron microscope.

Figure 13:
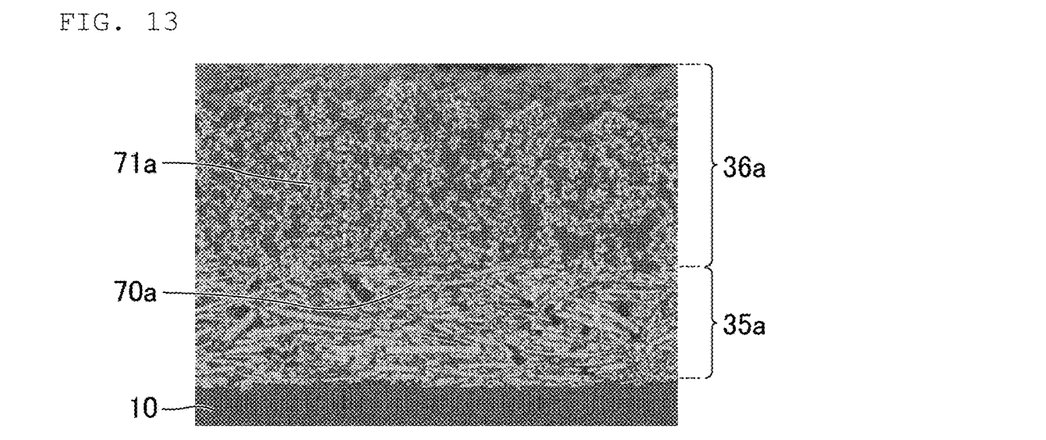
FIG. 13 is a sectional photograph showing a state at the time of completion of the second electrode layer forming step in a manufacturing process of a stretchable mounting board of a first example.
Figure 14:
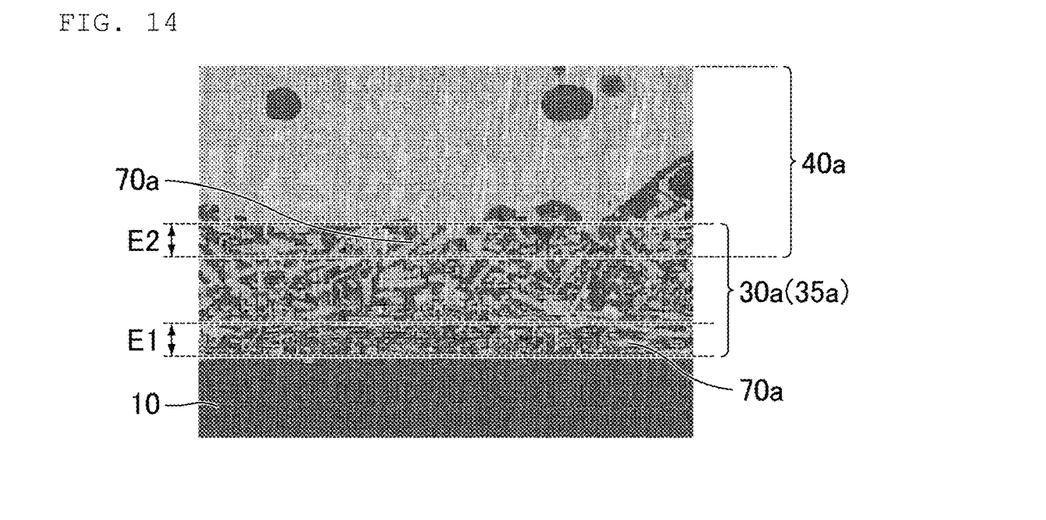
FIG. 14 is a sectional photograph showing a state at the time of completion of the electronic component mounting step in the manufacturing process of the stretchable mounting board of the first example.

FIG. 13 is a sectional photograph showing a state at the time of completion of the second electrode layer forming step in the manufacturing process of the stretchable mounting board of the first example. FIG. 14 is a sectional photograph showing a state at the time of completion of the electronic component mounting step in the manufacturing process of the stretchable mounting board of the first example.

As illustrated in FIG. 13, it was confirmed that the first electrode layer 35a contained a plate-shaped silver filler 70a and the second electrode layer 36a contained a spherical silver filler 71a in the state at the completion of the second electrode layer forming step in the manufacturing process of the stretchable mounting board of the first example.

On the other hand, as illustrated in FIG. 14, it was confirmed that in the state at the time of completion of the electronic component mounting step in the manufacturing process of the stretchable mounting board of the first example, the second electrode layer 36a was taken into the solder portion 40a. In addition, in the first electrode layer 35a, that is, in the mounting electrode portion 30a, it was confirmed that the sectional area of the silver filler 70a present in the second region E2 was larger than the sectional area at the time of completion of the second electrode layer forming step illustrated in FIG. 13. Further, in the mounting electrode portion 30a, it was confirmed that the sectional area of the silver filler 70a present in the first region E1 maintained the sectional area at the time of completion of the second electrode layer forming step illustrated in FIG. 13, and was smaller than the sectional area of the silver filler 70a present in the second region E2 also by the above-described method.

Next, a sectional photograph of a state at the time of completion of the electronic component mounting step in the manufacturing process of the stretchable mounting board of the first comparative example was taken using the scanning electron microscope.

Figure 15:
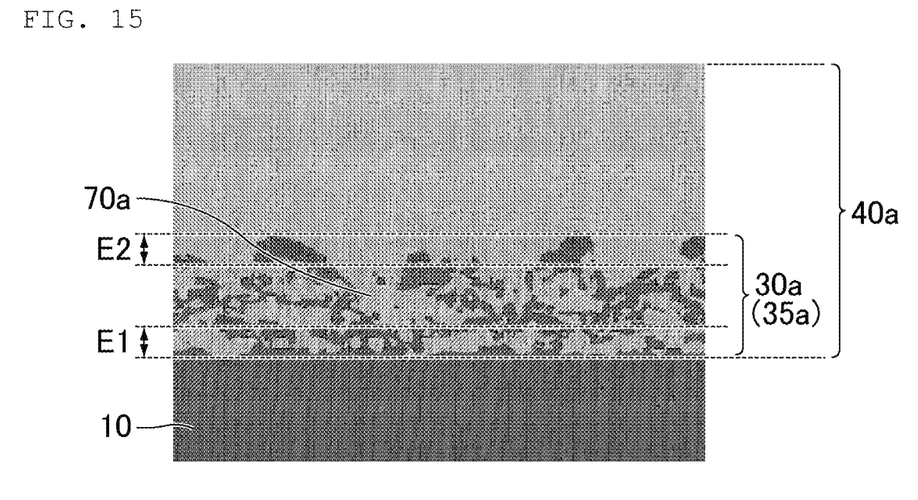
FIG. 15 is a sectional photograph showing a state at the time of completion of the electronic component mounting step in a manufacturing process of a stretchable mounting board of a first comparative example.

FIG. 15 is a sectional photograph showing a state at the time of completion of the electronic component mounting step in the manufacturing process of the stretchable mounting board of the first comparative example.

As illustrated in FIG. 15, it was confirmed that in the state at the time of completion of the electronic component mounting step in the manufacturing process of the stretchable mounting board of the first comparative example, the solder portion 40a reached the interface between the stretchable substrate 10 and the mounting electrode portion 30a, and the whole mounting electrode portion 30a was taken into the solder portion 40a. Therefore, it was confirmed that the sectional area of the silver filler 70a was large at any position of the mounting electrode portion 30a, and the sectional area of the silver filler 70a present in the second region E2 was not larger than the sectional area of the silver filler 70a present in the first region E1 also by the above-described method. This is considered to be because the first electrode layer was formed to be thin as compared with the manufacturing process of the stretchable mounting board of the first example, and the solder paste configuring the solder portion 40a was likely to spread out to the first electrode layer. In the first electrode layer forming step, the first conductive paste containing a blocked isocyanate was used, but it is considered that when the first electrode layer is formed by performing heat treatment at a temperature lower than the dissociation temperature of the blocking agent or performing heat treatment under a curing condition insufficient for the polymerization reaction, in the electronic component mounting step, the resin contained in the first electrode layer is dissolved in the flux component of the solder paste, and a state similar to that of the stretchable mounting board of the first comparative example is obtained.

[Evaluation 2]

For the stretchable mounting board of the first example and the stretchable mounting board of the first comparative example, a shear strength (also referred to as a shearing strength) was measured as follows. First, for the stretchable mounting board of each example, three samples each having a rigid body bonded to another main surface (the main surface opposite to the electronic component) of the stretchable substrate were prepared. Next, for the stretchable mounting board of each example, the shear strength in the long side direction of the three samples was measured with a shear tester. For the stretchable mounting board of each example, the average value and the minimum value of the shear strengths of the three samples are shown in Table 1.

TABLE 1

|  |  | First Example | First Comparative Example |
|---|---|---|---|
| Shear strength (N) | Average value | 3.9 | 2.8 |
|  | Minimum value | 3.4 | 2.2 |

As shown in Table 1, in the stretchable mounting board of the first example, both the average value and the minimum value of the shear strength were higher than those of the stretchable mounting board of the first comparative example. That is, it was found that the stretchable mounting board of the first example had a mounting strength of the electronic component higher than the stretchable mounting board of the first comparative example.

In the stretchable mounting board of each example, a fracture site generated at the time of shear strength measurement was the interface between the stretchable substrate and the mounting electrode portion. From this, as in the stretchable mounting board of the first comparative example, in a case where the solder portion reaches the interface between the stretchable substrate and the mounting electrode portion, that is, in the mounting electrode portion, the sectional area of the conductive filler present in the second region is not larger than the sectional area of the conductive filler present in the first region, it has been found that the connection between the stretchable substrate and the mounting electrode portion is not secured, and as a result, the mounting strength of the electronic component decreases. That is, as in the stretchable mounting board of the first example, in the mounting electrode portion, in a case where the sectional area of the conductive filler present in the second region is larger than the sectional area of the conductive filler present in the first region, it has been found that the connection between the stretchable substrate and the mounting electrode portion is secured, and as a result, the mounting strength of the electronic component increases.

DESCRIPTION OF REFERENCE SYMBOLS 1, 1': Stretchable mounting board
10: Stretchable substrate
11a: One main surface of stretchable substrate
20a, 20b: Stretchable wiring
30a, 30b: Mounting electrode portion
31a, 31b: First main surface of mounting electrode portion
32a, 32b: Second main surface of mounting electrode portion
35a, 35b: First electrode layer
36a, 36b: Second electrode layer
40a, 40b: Solder portion
45a, 45b: Solder paste
50: Electronic component
60a, 61a: Conductive filler
70a, 71a: Silver filler
D1: Region near interface between first electrode layer and stretchable substrate in first electrode layer
D2: Region near interface between first electrode layer and second electrode layer in first electrode layer
E1, F1: First region of mounting electrode portion
E2, F2: Second region of mounting electrode portion
L1: First straight line
L2: Second straight line
L3: Third straight line
L4: Fourth straight line
L5: Fifth straight line
M1, M2: Straight line
P1: First end point
P2: Second end point
R1: Length of region in contact with solder portion in second region of mounting electrode portion
R2: Length of whole second region of mounting electrode portion

The invention claimed is:

1. A stretchable mounting board comprising:
a stretchable substrate;
a mounting electrode portion on a main surface side of the stretchable substrate and containing a conductive filler and a resin;
a solder portion connected to the mounting electrode portion; and
an electronic component electrically connected to the mounting electrode portion with the solder portion interposed therebetween,
wherein the mounting electrode portion has a first main surface on a stretchable substrate side thereof, a second main surface on a solder portion side thereof, a first region including the first main surface, and a second region including the second main surface, and
wherein, in a cross-section along a thickness direction of the mounting electrode portion passing through the first region and the second region, a sectional area of the conductive filler in the second region is larger than a sectional area of the conductive filler in the first region.

2. The stretchable mounting board according to claim 1, wherein the solder portion extends into the second region of the mounting electrode portion.

3. The stretchable mounting board according to claim 2, wherein, in the mounting electrode portion, the conductive filler present in the second region is integrated with the solder portion.

4. The stretchable mounting board according to claim 1, wherein a thickness of the mounting electrode portion is 10 μm or more.

5. The stretchable mounting board according to claim 1, wherein a thickness of the mounting electrode portion is 10 μm to 40 μm.

6. The stretchable mounting board according to claim 1, further comprising a stretchable wiring having an end portion thereof that sandwiches an end portion of the mounting electrode portion with the stretchable substrate.

7. The stretchable mounting board according to claim 1, further comprising a stretchable wiring having an end portion thereof between the stretchable substrate and the mounting electrode portion.

8. A method for manufacturing a stretchable mounting board, the method comprising:
forming a first electrode layer by applying a first conductive paste containing a first conductive filler and a thermosetting resin to a main surface side of a stretchable substrate;
performing a first heat treatment on the first electrode layer;

forming a second electrode layer by applying a second conductive paste containing a second conductive filler and a thermoplastic resin to the first electrode layer on a side thereof opposite to the stretchable substrate;

performing a second heat treatment on the second electrode layer;

applying a solder paste onto the second electrode layer;

mounting an electronic component on the solder paste; and performing a third heat treatment to melt and solidify the solder paste to form a solder portion that bonds the electronic component and the first electrode layer with the solder portion interposed therebetween.

9. The method for manufacturing a stretchable mounting board according to claim 8, wherein both the application of the first conductive paste and the application of the second conductive paste are performed by a screen printing method.

10. The method for manufacturing a stretchable mounting board according to claim 8, wherein the solder paste contains tin and bismuth as metal components.

11. The method for manufacturing a stretchable mounting board according to claim 8, wherein the third heat treatment forms a mounting electrode portion on the main surface side of the stretchable substrate, the mounting electrode portion containing the first conductive filler and having a first main surface on a stretchable substrate side thereof, a second main surface on a solder portion side thereof, a first region including the first main surface, and a second region including the second main surface, and wherein, in a cross-section along a thickness direction of the mounting electrode portion passing through the first region and the second region, a sectional area of the first conductive filler in the second region is larger than a sectional area of the first conductive filler in the first region.

12. The method for manufacturing a stretchable mounting board according to claim 11, wherein the solder portion extends into the second region of the mounting electrode portion.

13. The method for manufacturing a stretchable mounting board according to claim 12, wherein, in the mounting electrode portion, the first conductive filler present in the second region is integrated with the solder portion.

14. The method for manufacturing a stretchable mounting board according to claim 11, wherein a thickness of the mounting electrode portion is 10 μm or more.

15. The method for manufacturing a stretchable mounting board according to claim 11, wherein a thickness of the mounting electrode portion is 10 μm to 40 μm.

16. The method for manufacturing a stretchable mounting board according to claim 11, further comprising forming a stretchable wiring having an end portion thereof that sandwiches an end portion of the mounting electrode portion with the stretchable substrate.

17. The method for manufacturing a stretchable mounting board according to claim 8, further comprising forming a stretchable wiring having an end portion thereof between the stretchable substrate and the mounting electrode portion.

* * * * *